(12) United States Patent
Wang et al.

(10) Patent No.: US 9,341,669 B2
(45) Date of Patent: May 17, 2016

(54) TESTING APPARATUS

(71) Applicant: Industrial Technology Research Institute, Hsinchu (TW)

(72) Inventors: Chien-Ping Wang, Hsinchu County (TW); Tzung-Te Chen, Taipei (TW); Yen-Liang Liu, Taipei (TW); Chun-Fan Dai, Kaohsiung (TW); Han-Kuei Fu, New Taipei (TW); Pei-Ting Chou, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 489 days.

(21) Appl. No.: 14/029,803

(22) Filed: Sep. 18, 2013

(65) Prior Publication Data

US 2014/0015531 A1    Jan. 16, 2014

Related U.S. Application Data

(63) Continuation-in-part of application No. 13/587,498, filed on Aug. 16, 2012, which is a continuation-in-part of application No. 12/823,859, filed on Jun. 25, 2010, now abandoned.

(30) Foreign Application Priority Data

Dec. 9, 2009    (TW) ................................ 98142003 A

(51) Int. Cl.
*G01R 31/00*    (2006.01)
*G01R 31/26*    (2014.01)

(52) U.S. Cl.
CPC .................................. *G01R 31/2635* (2013.01)

(58) Field of Classification Search
CPC ........... G01R 31/2635; G01R 31/3637; G01N 27/44791; G01N 27/419

USPC .......... 324/414, 762.08, 762.07, 762.09, 410, 324/403, 500–555; 702/57, 130, 136, 60, 702/63, 82; 362/295

See application file for complete search history.

(56) References Cited

U.S. PATENT DOCUMENTS 6,867,575 B2    3/2005    D'Cunha
7,960,929 B2    6/2011    Niikura
(Continued)

FOREIGN PATENT DOCUMENTS

TW         359050        5/1999
TW         M256024       1/2005

OTHER PUBLICATIONS

"LED Thermal Testing"(http://www.avagotech.com/docs/AV02-3484EN), Apr. 28, 2012, pp. 1-4.
(Continued)

*Primary Examiner* — Melissa Koval
*Assistant Examiner* — Trung Nguyen
(74) *Attorney, Agent, or Firm* — Jianq Chyun IP Office

(57) ABSTRACT

The disclosure discloses a light emitting diode testing apparatus, which includes a power supply module, a probe, a control unit and a data acquisition unit. The power supply module provides a first current or a second current to a testing item. The probe measures characteristics of the testing item. The control unit controls the power supply module to provide the first current or the second current. The data acquisition unit acquires the characteristics of the testing item from the probe. The power supply module includes a first current source, at least one second current source and at least one protector. The first current source provides the first current to the testing item. The at least one second current source provides at least one additional current. The at least one protector prevents the first current from feeding back to the at least one second current source.

24 Claims, 12 Drawing Sheets

(56) References Cited

U.S. PATENT DOCUMENTS

| | | | |
|---|---|---|---|
| 8,766,548 B2* | 7/2014 | Chew | H05B 33/0821 315/192 |
| 2004/0109333 A1 | 6/2004 | D'Cunha | |
| 2013/0307549 A1* | 11/2013 | Liu | G01J 1/0252 324/414 |

OTHER PUBLICATIONS

Andras Poppe et al., "Emerging standard for thermal testing of power LEDs and its possible implementation," Proc. of SPIE, vol. 7784, Aug. 1, 2010, pp. 1-15.

Hong min Wang et al., "High power LED thermal performance test analysis and its research methods," The 6th International Forum on Strategic Technology, Aug. 22-24, 2011, pp. 517-520.

Ma Chunlei and Bao Chao, "Study on Measurement Method of Thermal Performances for High Power LED and its Applications," Acta Photonica Sinica, vol. 34, No. 12, Dec. 2005, pp. 1-4.

Robert O. Reynolds et al., "Qualification of LEDs for Cameras on NASA's Phoenix Mars Lander," Proc. of SPIE, vol. 7095, Aug. 10, 2008, pp. 1-12.

F.N. Masana, "A straightforward analytical method for extraction of semiconductor device transient thermal parameters," Microelectronics Reliability, Nov. 14, 2006, pp. 2122-2128.

Paul Benjamin Crilly, "A Quantitative Evaluation of Various Iterative Deconvolution Algorithms," IEEE Transactions on Instrumentation and Measurement, vol. 40, No. 3, Jun. 1991, pp. 1-4.

Nikolaos Tsakalozos et al., "Signal Extrapolation Using Empirical Mode Decomposition With Financial Applications," IEEE International Conference on Acoustics, Speech and Signal Processing (ICASSP), May 22-27, 2011, pp. 5744-5747.

Weidong Chen, "A Fast Convergence Algorithm for Band-Limited Extrapolation by Sampling," IEEE Transactions on Signal Processing, vol. 57, No. 1, Jan. 2009, pp. 161-167.

Duo Deng and Thomas A. Lipo, "A Modified Control Method for Fast-Response Current Source Inverter Drives," IEEE Transactions on Industry Applications, vol. IA-22, No. 4, Jul./Aug. 1986, pp. 653-665.

Manuel Carmona et al., "A Time-Domain Method for the Analysis of Thermal Impedance Response Preserving the Convolution Form," IEEE Transactions on Components and Packaging Technology, vol. 22, No. 2, Jun. 1999, pp. 238-244.

H. Chui et al., "Chapter 2 High-Efficiency AIGaInP Light-Emitting Diodes," Electroluminescene I, Volume (Semiconductors & Semimetals), Oct. 29, 1999, pp. 1.

* cited by examiner

TESTING APPARATUS

CROSS-REFERENCE TO RELATED APPLICATION

This application is a continuation-in-part of and claims the priority benefit of U.S. application Ser. No. 13/587,498, filed on Aug. 16, 2012. The prior U.S. application Ser. No. 13/587,498 is a continuation-in-part of U.S. application Ser. No. 12/823,859, filed on Jun. 25, 2010. The prior U.S. application Ser. No. 12/823,859 claims the priority benefit of Taiwan application serial no. 98142003, filed on Dec. 9, 2009. The entirety of each of the above-mentioned patent applications is hereby incorporated by reference herein and made a part of this specification.

BACKGROUND

1. Field of the Invention

The present disclosure generally relates to a light emitting diode (LED) testing apparatus.

2. Description of Related Art

Nowadays light emitting diodes (LED) are widely used in a variety of applications such as indicator lamps, general lighting, automotive lighting, and advertising. In addition, video displays and sensors are also to be developed using LED devices. With the development of LEDs, the devices are subject to junction temperatures and current densities. These tend to cause excessive thermal stresses on the material, and may cause light-output degradation as most of the inputted power is converted to heat. Under this circumstance, the LED light performance is very much affected by temperature.

In general, thermal testing of LED devices is to measure the temperature rise, so as to ensure that the maximum junction temperature is not exceeded. The thermal resistance is defined as a property of the junction temperature of an LED device. Consequently, the thermal resistance is a critical parameter for evaluating a heat dissipation performance of an LED device. The conventional thermal measurement methods of LED devices are similar to those of general IC chips. The conventional methods for measuring LED thermal characteristics include two steps. The conventional LED thermal measurement methods begin with the first step of measuring a temperature sensitive parameter (TSP). A heating current, such as 300 mA, is provided to an LED device by a current source, and a voltage meter is used for measuring a relation between a temperature and an output voltage. Subsequently, the heating current is switched to a small current, such as 1 mA. A forward voltage under the small current is measured as the calculation of the device temperature. These steps are repeated many times. Moreover, there are some other conventional LED thermal measurement technologies, which are used for measuring the thermal resistance. Overall, these conventional thermal measurement methods are usually complicated and very time-consuming, and these aforesaid methods for measuring the accurate thermal resistance are all restricted due to the TSP value measurement, requiring a steady-state testing condition. Therefore, these thermal measurement methods or approaches require a longer time to monitor temperature at equilibrium, and are not suitable for fast measurement of thermal resistances and thermal electric characteristics of LED devices under different temperatures.

Accordingly, it is necessary to provide a method for measuring a thermal characteristic and a chip temperature of an LED device in a fast manner.

The above-described deficiencies of today's LED thermal measurement are merely intended to provide an overview of some of the problems of the conventional methods, and are not intended to be exhaustive. Other problems with conventional methods and corresponding benefits of the various non-limiting embodiments described herein may become further apparent upon review of the following description.

SUMMARY

The disclosure is directed to a light emitting diode testing apparatus. The testing apparatus includes a power supply module, a probe, a control unit and a data acquisition unit. The power supply module provides a first current or a second current to a testing item. The probe is coupled to the power supply module and configured to measure characteristics of the testing item. The control unit is coupled to the power supply module and configured to control the power supply module to provide the first current or the second current. The data acquisition unit is coupled to the control unit and the probe and configured to acquire the characteristics of the testing item from the probe. The power supply module includes a first current source, at least one second current source and at least one protector. The first current source is coupled to the testing item and configured to provide the first current to the testing item. The at least one second current source is coupled to the first current source and the testing item through the at least one protector and configured to provide at least one additional current. The second current is a combination of the first current and the at least one additional current. The at least one protector is configured to prevent the first current from feeding back to the at least one second current source.

The disclosure is directed to a light emitting diode testing apparatus. The testing apparatus includes a power supply module, a temperature controller, a control unit and a data acquisition unit. The power supply module provides a first current or a second current to a testing item. The temperature controller controls a temperature of the testing item. The control unit is coupled to the power supply module and the temperature controller. The control unit controls the power supply module to provide the first current or the second current, and controls the temperature controller to adjust the temperature of the testing item. The data acquisition unit is coupled to the control unit and configured to acquire characteristics of the testing item. The power supply module includes a first current source, at least one second current source and at least one protector. The first current source is coupled to the testing item and configured to provide the first current to the testing item. The at least one second current source is coupled to the first current source and the testing item through the at least one protector and configured to provide at least one additional current. The second current is a combination of the first current and the at least one additional current. The at least one protector is configured to prevent the first current from feeding back to the at least one second current source.

In order to make the aforementioned and other features and advantages of the disclosure comprehensible, several exemplary embodiments accompanied with figures are described in detail below.

DETAILED DESCRIPTION OF DISCLOSED EMBODIMENTS

The following exemplary embodiments will be described fully with reference to the accompanying drawings. However, the present disclosure may be embodied in many different forms, and should be constructed but not limited to the exemplary embodiments set forth herein. Additionally, these embodiments are provided so that the present disclosure will be complete and thorough. Besides, these exemplary embodiments will plentifully convey the present disclosure to persons skilled in the art.

The present disclosure provides a method for rapidly measuring thermal electric characteristics of a semiconductor device, i.e., a light emitting diode (LED) device, so as to resolve time-consuming temperature measurement issues associated with LED devices.

In accordance with some aspects of the present disclosure, the LED device contains an LED die. The LED die is die-bonded on a package carrier. A package interface is formed between the LED die and the package carrier. The package interface includes thermal conductive adhesive, silver paste, eutectic ally, and so forth. Moreover, the LED device further contains a circuit board and an assembly interface. The package carrier is assembled on the circuit board, and the assembly interface is formed between the package carrier and the circuit board.

Figure 1:
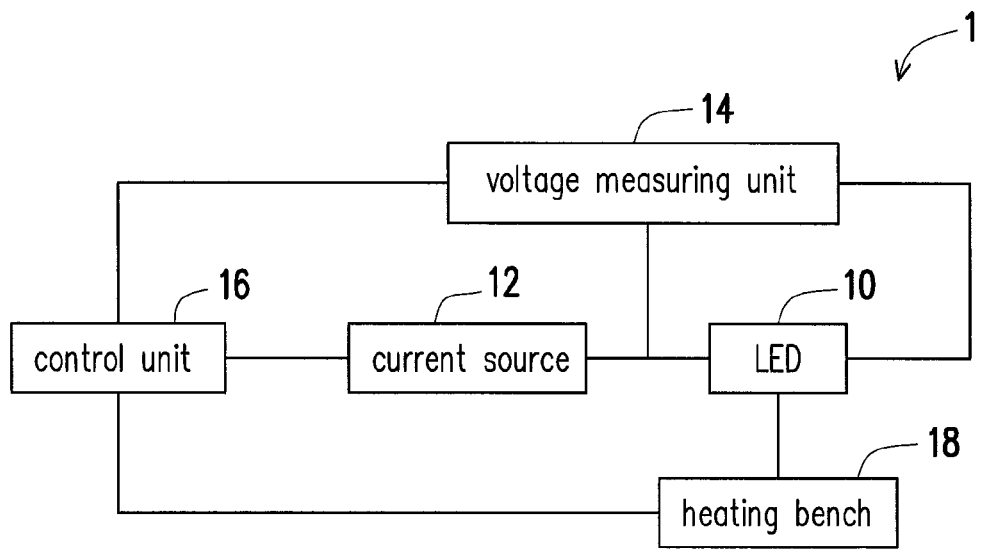
FIG. 1 shows a block diagram of an apparatus for performing a method of rapidly measuring thermal electric characteristics of an LED device in accordance with an exemplary embodiment of the present disclosure.

In order to clearly describe the method for rapidly measuring thermal electric characteristics of an LED device, an apparatus for performing the fast thermal measurement method of the present disclosure is described as follows. FIG. 1 shows a block diagram of the apparatus 1 for rapidly measuring thermal electric characteristics of an LED device 10 according to one embodiment of the present disclosure. Referring to FIG. 1, the apparatus 1 includes an LED device 10, a current source 12, a voltage measuring unit 14, a control unit 16, and a heating bench 18. In accordance with one exemplary embodiment, the LED device 10 is similar to the LED device described above.

Figure 2:
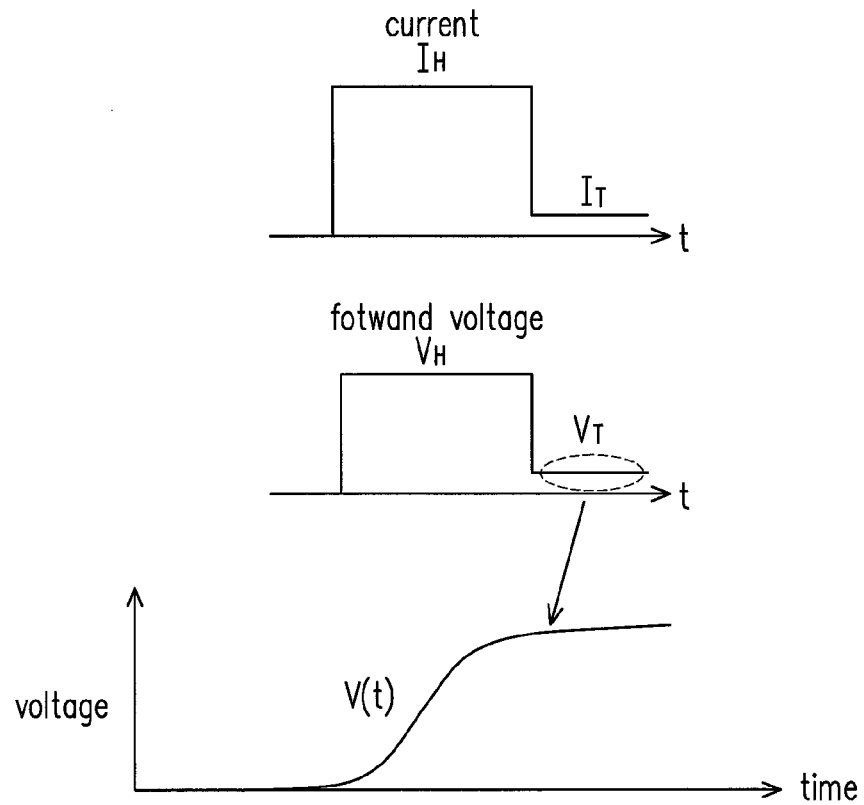
FIG. 2 shows a diagram of a relation between a current, a forward voltage and a voltage transient response in accordance with an exemplary embodiment of the present disclosure.

According to one exemplary embodiment of the present disclosure, referring to FIGS. 1 and 2, the control unit 16 provides a control signal to control the current source 12 for generating a heating current $I_H$ to the LED device 10. The temperature of the LED device 10 rises due to the heating current $I_H$ generally greater than 10 mA, as shown in FIG. 2. It is noted that the heating current $I_H$ can be adjusted based on the size of an LED device. When the heating current $I_H$ is switched to a testing current $I_T$, the temperature of the LED device 10 will be cooling down. The testing current $I_T$ is generally between 0.1 mA and 10 mA. In this exemplary embodiment, the control unit 16 provides a control signal to control the voltage measuring unit 14 for measuring a voltage transient response from heating up the LED device 10 under the heating current $I_H$ to cooling down the LED device 10 under the testing current $I_T$. In another exemplary embodiment, the voltage transient response can be measured from cooling down the LED device 10 under the testing current $I_T$ to heating up the LED device 10 under the heating current $I_H$. The voltage transient response associated with a forward voltage of the junction of the LED device 10 is temperature dependent. The forward voltage includes a forward heating voltage $V_H$ and a forward testing voltage $V_T$, and the forward heating voltage $V_H$ and the forward testing voltage $V_T$ are generated by the heating current $I_H$ and the testing current $I_T$, respectively. In addition, the LED device 10 is contacted by at least two electrical testing probe pins or a set of probe pins, and thus the voltage transient response associated with the forward voltage of the LED device 10 is measured by the voltage measuring unit 14 through the at least two electrical testing probe pins or the set of probe pins.

According to another exemplary embodiment, the control unit 16 provides a control signal to the heating bench 18, on which the LED device 10 is placed. The LED device 10 is heating up via the heating bench 18, and thus the temperature of the LED device 10 rises. In order to ensure that the temperature of the LED device 10 rises exactly, a heating interval is generally greater than 10 us, and a heating temperature is between 25° C. and 300° C. In this exemplary embodiment, the control unit 16 also provides a control signal to control the voltage measuring unit 14 for measuring a voltage transient response from heating up the LED device 10 under the heating condition to cooling down the LED device 10. In another exemplary embodiment, the voltage transient response can be measured from cooling down the LED device 10 to heating up the LED device 10 under the heating condition. The voltage transient response associated with a forward voltage of the junction of the LED device 10 is temperature dependent. Further, the LED device 10 is also contacted by at least two electrical testing probe pins or a set of probe pins, and thus the voltage transient response associated with the forward voltage of the LED device 10 is measured by the voltage measuring unit 14, which is controlled by the control unit 16, through the at least two electrical testing probe pins or the set of probe pins.

Figure 3:
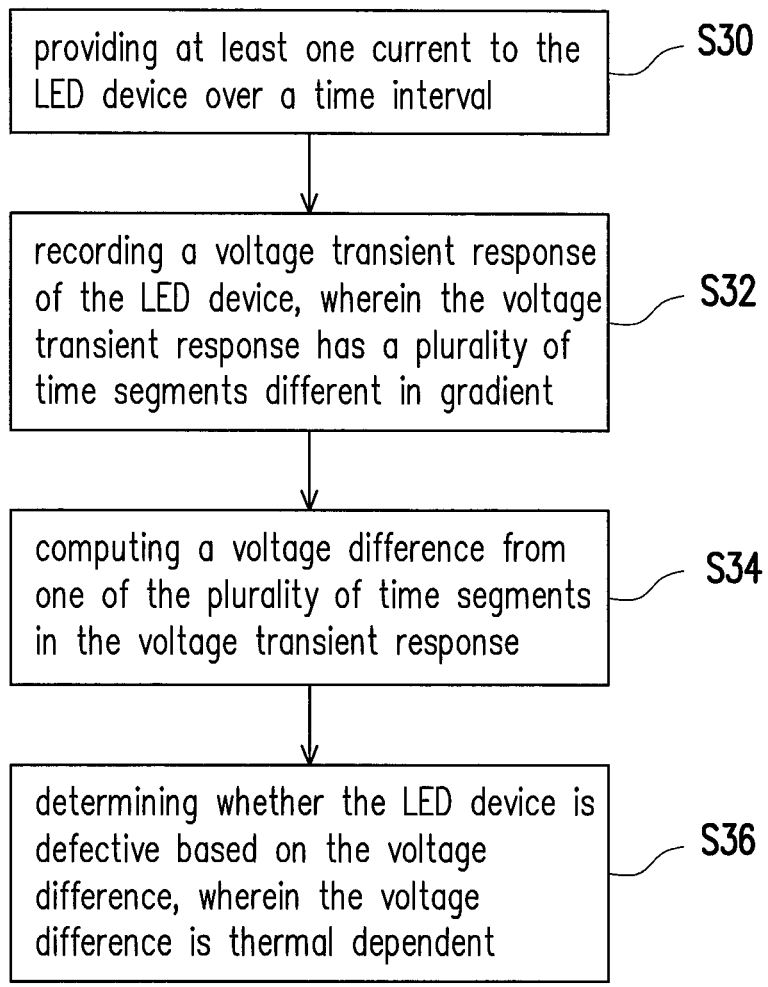
FIG. 3 shows a flowchart of the method for rapidly measuring thermal electric characteristics of an LED device in accordance with an exemplary embodiment of the present disclosure.

In one exemplary embodiment of the present disclosure, referring to FIG. 3, a flowchart of the method for measuring thermal electric characteristics of an LED device in a fast manner is shown. The method for rapidly measuring thermal electric characteristics of an LED device includes the following steps. The method begins with step S30 of providing at least one current to the LED device over a time interval. In step S32, a voltage transient response associated with a forward voltage of the LED device is recorded, wherein the voltage transient response has a plurality of time segments different in gradient. Subsequently, in step S34, a voltage difference from one of the plurality of time segments in the voltage transient response is computed. Afterwards, in step S36, whether the LED device is defective is determined based on the voltage difference that is thermal dependent. That is to say, according to one exemplary embodiment of the present disclosure, the voltage difference is proportional to the temperature difference, the thermal resistance and the junction temperature.

Figure 4:
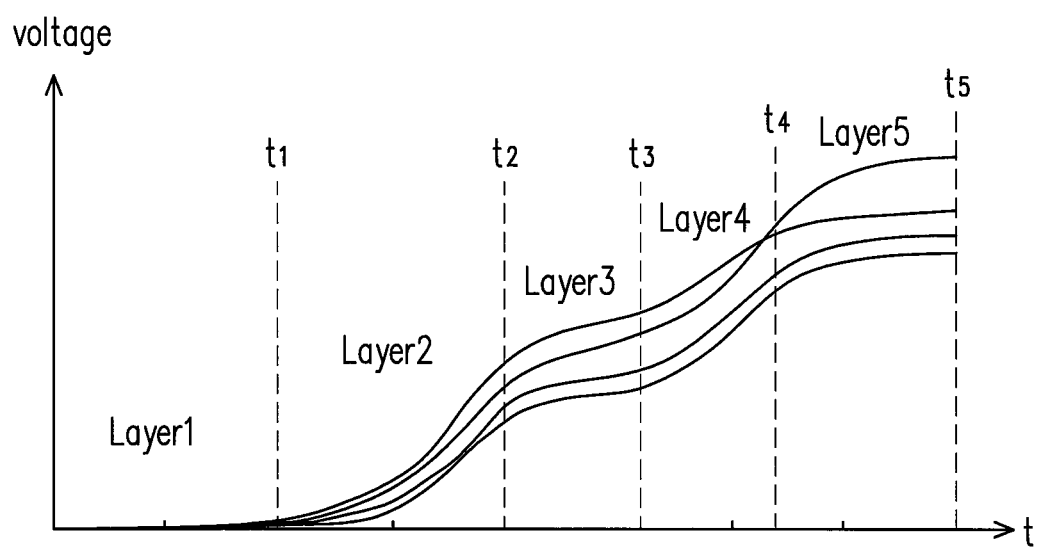
FIG. 4 shows a diagram of a voltage transient response associated with different LED devices over a plurality of time segments in accordance with an example of the present disclosure.

In an example of the present disclosure, FIG. 4 with regard to four different LED devices with an area of 1 mm$^2$, the initial gradient of the voltage transient response is close to zero, and then the gradient rises at time t1. It can be seen from FIG. 4 that the time interval between 0 and time t1 is the first layer temperature of the LED device. Moreover, the gradient will be changed again at time t2 by the temperature of the second layer of the LED device after time t1, and thus the time interval between time t1 and time t2 is the second layer temperature of the LED device. Afterwards, the gradient will be changed at time t3 by the temperature of the third layer of the LED device. As such, the time interval between time t2 and time t3 is the third layer temperature of the LED device. Similarly, the gradient will be changed at time t4 by the temperature of the fourth layer of the LED device, and the time interval between time t3 and time t4 is the fourth layer temperature of the LED device. Hence, the time interval between time t4 and time t5 is the fifth layer temperature of the LED device. Accordingly, a material layer is initially selected, and a voltage difference from one of the plurality of time segments in the voltage transient response is subsequently computed. Whether the LED device is defective is then determined based on the voltage difference.

Further, in accordance with one exemplary embodiment of the present disclosure, the method further includes the following steps for computing the voltage transient response. The voltage transient response over a time interval (e.g., from t1 to t2) can be further summed up, i.e., $$VS = \sum_{t1}^{t2} VF(t),$$

where VF(t) is the voltage transient response, VS is the voltage difference. In accordance with another exemplary embodiment of the present disclosure, the voltage transient response can be further computed by using the first derivative or higher derivatives and then summed up over a time interval (i.e., $$VS = \sum_{t1}^{t2} \frac{d^{(n)} VF(t)}{dt^{(n)}} ).$$

In accordance with an alternative exemplary embodiment of the present disclosure, the voltage transient response can be further computed by using higher derivatives and then computed by the definite integral (i.e., VS=$\int_{t1}^{t2}$VF(t)dt) or higher definite integrals over a time interval (i.e., $$VS = \int_{t1}^{t2} \cdots \int_{t1}^{t2} \frac{d^{(n)} VF(t)}{dt^{(n)}} dt ).$$

That is to say, the voltage transient response can be further computed and processed by way of using the first derivative, higher derivatives, a summation, the definite integral, higher definite integrals, or the combination thereof.

Additionally, in accordance with the above exemplary embodiment of the present disclosure, the thermal resistance can be differentiated by three grades (i.e., A, B and C). For example, grade A is less than 9 K/W; grade B is between 9 and 13 K/W; and grade C is greater than 13 K/W. It is noted that the grades of the thermal resistance can be modified according to different applications of the LED device in actual situations, and will not restrict the scope of the disclosure.

In accordance with some aspects, the at least one current is a heating current $I_H$ and a testing current $I_T$, and the heating current $I_H$ can be a forward direct current or a pulse heating current. Additionally, when a value of the heating current $I_H$ is greater than 10 mA, the temperature of the LED device rises, and when a value of the testing current $I_T$ is between 0.1 mA and 10 mA, a rise in temperature of the LED device is prevented. In other words, in an instance, when the heating current $I_H$ is switched to the testing current $I_T$, the temperature of the LED device 10 will be cooling down. In another instance, when the testing current $I_T$ is changed to the heating current $I_H$, the temperature of the LED device 10 will be heating up. Moreover, a switching time between the heating current $I_H$ and the testing current $I_T$ is within 300 us, preferably within 50 us. In accordance with one aspect, a heating interval is greater than 10 us, and a heating temperature is between 25° C. and 300° C.

In accordance with one exemplary embodiment of the present disclosure, the method further comprises the steps as follows. The voltage transient response measured by the voltage measuring unit 14 is transferred to a logarithm scale by using the logarithm, and the voltage transient response is obtained from a forward heating voltage $V_H$ of the LED device 10. In another exemplary embodiment, the voltage transient response can also be obtained from the a forward testing voltage $V_T$ of the LED device 10, of which the forward heating voltage $V_H$ and the forward testing voltage $V_T$ are generated by the heating current $I_H$ and the testing current $I_T$, respectively.

Moreover, in accordance with one exemplary embodiment of the present disclosure, the method further comprises the following steps. The voltage transient response over a time interval can be further summed up. In accordance with another exemplary embodiment of the present disclosure, the voltage transient response can be further computed by using the first derivative or higher derivatives and then summed up over a time interval. In accordance with an alternative exemplary embodiment of the present disclosure, the voltage transient response can be further computed by using higher derivatives and then computed by the definite integral or higher definite integrals over a time interval. That is to say, the voltage transient response can be further computed and processed by way of using the first derivative, higher derivatives, a summation, the definite integral, higher definite integrals, or the combination thereof.

By way of the above exemplary embodiments, the method of the present disclosure determines whether the LED device 10 is defective, based on the voltage difference value of the LED device 10. In other words, a threshold value of voltage difference can be set for determining whether the LED device 10 is defective or not. That is to say, the LED device 10 is determined defective if its voltage difference value is higher than the threshold value. Otherwise, the LED device 10 is determined non-defective. The threshold value of the voltage difference of the LED device 10 in the above embodiments, for example, is 0.019V. It is noted that the threshold value of the LED device 10 can be modified according to different applications of the LED device 10, and will not restrict the scope of the disclosure.

Furthermore, in one exemplary embodiment of the present disclosure, prior to using the method for rapidly measuring thermal electric characteristics of the LED device 10, a plurality of time segments representing various different layers of the LED device 10 are pre-defined by a testing method.

According to one exemplary embodiment of the testing method, an apparatus for performing the testing method of the present disclosure is provided and is similar to the apparatus 1 for performing the method of measuring thermal electric characteristics of an LED device. The apparatus for performing the testing method of the present disclosure includes an LED device, a current source, a voltage measuring unit, a control unit, and a heating bench. In accordance with one exemplary embodiment, the LED device is similar to the LED device 10 described above.

In accordance with one exemplary embodiment of the testing method, the control unit provides a control signal to control the current source for generating the heating current $I_H$ to the LED device. The temperature of the LED device rises since the heating current $I_H$ is greater than 10 mA, and when a value of the testing current $I_T$ is between 0.1 mA and 10 mA, a rise in temperature of the LED device is prevented. It is noted that the heating current $I_H$ can be adjusted based on the size of an LED devices. When the heating current $I_H$ is switched to a testing current $I_T$, the temperature of the LED device will be cooling down. In this exemplary embodiment, the control unit provides a control signal to control the voltage measuring unit for measuring a voltage transient response from heating up the LED device under the heating current $I_H$ to cooling down the LED device under the testing current $I_T$. In another exemplary embodiment, the voltage transient response can be measured from cooling down the LED device under the testing current $I_T$ to heating up the LED device under the heating current $I_H$. Hence, a switching time between the heating current $I_H$ and the testing current $I_T$ is within 300 us, preferably within 50 us, a heating interval is greater than 10 us, and a heating temperature is between 25° C. and 300° C.

The voltage transient response associated with a forward voltage of the junction of the LED device is temperature dependent. In addition, the LED device is contacted at least two electrical testing probe pins or a set of probe pins, and thus the voltage transient response associated with the forward voltage is measured by the voltage measuring unit through the at least two electrical testing probe pins or the set of probe pins.

In accordance with another exemplary embodiment of the testing method, the control unit provides the heating current to the heating bench, on which an LED device is placed. The LED device is heating up via the heating bench, and thus the temperature of the LED device rises. In order to ensure the temperature of the LED device an exact rise, a heating interval is greater than 10 us, and a heating temperature is between 25° C. and 300° C. In this exemplary embodiment, the control unit provides a control signal to control the voltage measuring unit for measuring a voltage transient response from heating up the LED device under the heating condition to cooling down the LED device. The voltage transient response associated with a forward voltage of the junction of the LED device is temperature dependent. Moreover, the LED device is also contacted by at least two electrical testing probe pins or a set of probe pins, and thus the voltage transient response associated with the forward voltage is measured by the voltage measuring unit through the at least two electrical testing probe pins or the set of probe pins.

Figure 5:
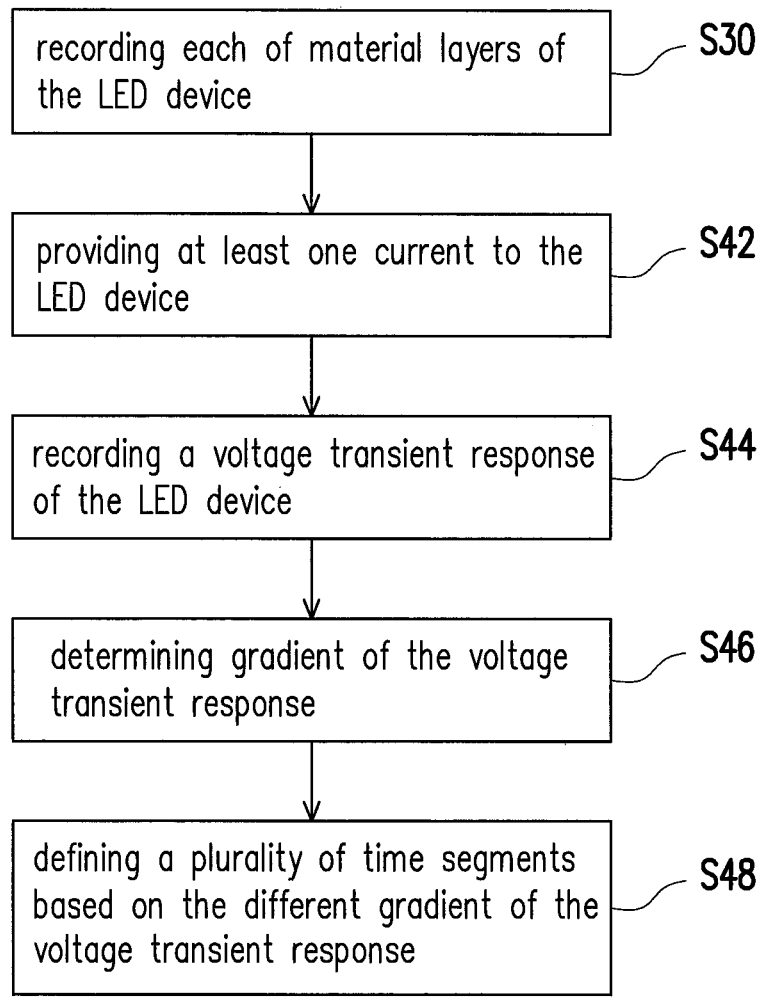
FIG. 5 shows a flowchart of a testing method for measuring thermal electric characteristics of a light emitting diode (LED) device in accordance with an exemplary embodiment of the present disclosure.

According to one exemplary embodiment, the present disclosure also provides a testing method for performing the method of measuring thermal electric characteristics of an LED device in a fast manner, as shown in FIG. 5. The testing method includes the steps as follows. The testing method begins with step S40 of recording each of material layers of the LED device. In step S42, at least one current is provided to the LED device. After the step S42, a voltage transient response associated with a forward voltage of the LED device is then measured and recorded in step S44. Subsequently, gradients of the voltage transient response are determined in step S46. In step S48, a plurality of time segments are defined based on the different gradients of the voltage transient response. Hence, the plurality of time segments, which are defined by the testing method, are utilized in the method for rapidly measuring thermal electric characteristics of an LED device of the present disclosure.

Once the plurality of time segments are determined and defined by the testing method, the method of rapidly measuring thermal electric characteristics of an LED device of the present disclosure is carried on in order to quickly determine the thermal performance status of LED devices.

The word "exemplary" is used herein to serve as an example, instance, or illustration. For the avoidance of doubt, the subject matter disclosed herein is not limited to such examples. Additionally, any aspect described herein as "exemplary" is not necessarily to be construed as preference over other aspects, nor is it meant to preclude equivalent exemplary structures and techniques which are known to persons skilled in the art. Furthermore, to the extent that the terms "include," "contain" and other similar words are used, for the avoidance of doubt, such terms are intended to be inclusive in a manner similar to the term "comprise" as an open transition word without precluding any additional or other elements.

In view of the exemplary embodiments described above, methodologies that may be implemented in accordance with the described subject matter can also be appreciated with reference to the flowcharts of the various figures. For purposes of simplicity of explanation, the methodologies are shown and described as a series of blocks, it is to be appreciated that the various embodiments are not limited to the order of the blocks, as some blocks may occur in different orders and/or concurrently with other blocks from what is depicted and described herein. Although the flow of methodologies is illustrated via a flowchart, it can be appreciated that flow paths and orders of the blocks may be implemented to achieve the same or a similar result. Moreover, not all the illustrated blocks may be required to implement the methodologies described herein.

In addition to the various embodiments described herein, it is to be understood that other similar embodiments can be used, or additions and modifications can be made to the various embodiments for performing the same or equivalent function of the corresponding embodiments without deviating therefrom. Accordingly, the present disclosure should not be limited to any single embodiment, but rather should be construed in breadth, spirit and scope according to the appended claims.

Figure 6:
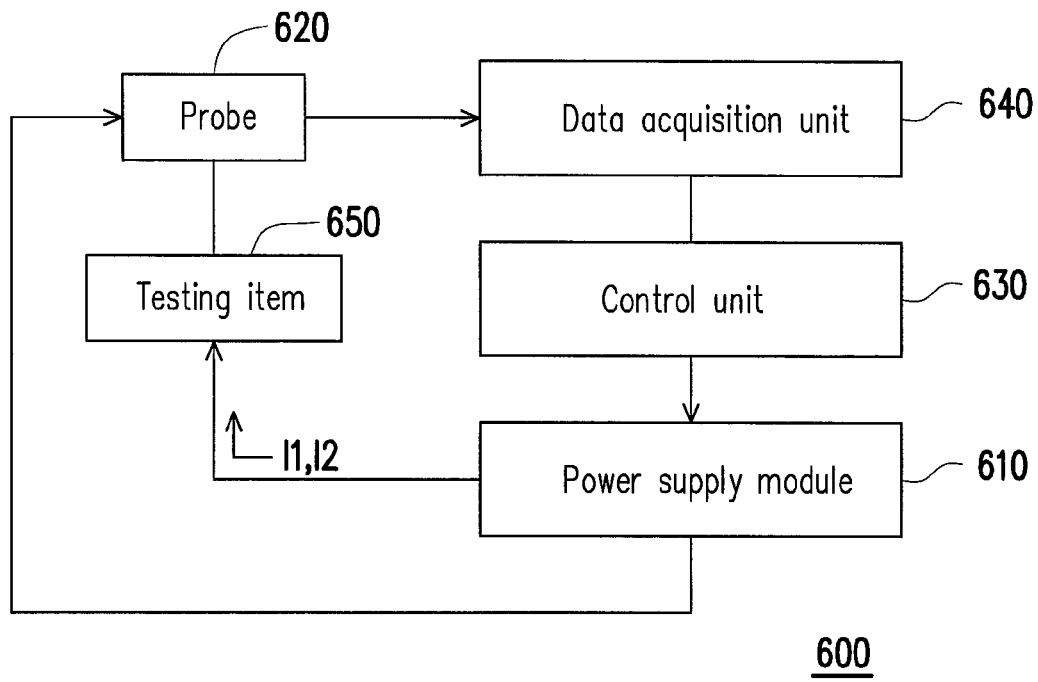
FIG. 6 is a schematic diagram illustrating a light emitting diode testing apparatus according to an exemplary embodiment of the disclosure.

FIG. 6 is a schematic diagram illustrating a light emitting diode testing apparatus according to an exemplary embodiment of the disclosure. In this embodiment, the testing apparatus 600 includes a power supply unit 610, a probe 620, a control unit 630 and a data acquisition unit 640. The power supply unit 610 may provide a first current I1 or a second current I2 to a testing item 650. The first current I1 and the second current I2 could be the testing current $I_T$ and the heating current $I_H$ as illustrated in FIG. 2, respectively, but the disclosure is not limited thereto. In some embodiments, the first current I1 may be between 1 mA to 10 mA. The testing item 650 may be a regular LED (e.g., the LED 10) or some other kind of LEDs, but the disclosure is not limited thereto. The probe 620 is coupled to the power supply module 610 and may be configured to measure characteristics of the testing item 650. As mentioned in the previous paragraphs, the probe 620 may include at least two electrical testing probe pins or a set of probe pins configured to measure the characteristics of the testing item 650 by contacting the testing item 650. The at least two electrical testing probe pins or a set of probe pins may be simplified as a connection line between the probe 620 and the testing item 650 as illustrated in FIG. 6. The characteristics of the testing item 650 (e.g., an LED) could be, but not limited to, the aforementioned thermal electric characteristics of the testing item 650.

The control unit 630 may be coupled to the power supply module 610. The control unit 630 may be, for example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Array (FPGAs) circuits, any other type of integrated circuit (IC), a state machine, an ARM-based processor, and the like. The control unit 630 may be configured to control the power supply module 610 to provide the first current I1 or the second current I2. The data acquisition unit 640 may be coupled to the control unit 630 and the probe 620 and configured to acquire the characteristics of the testing item 650.

In some embodiments, after acquiring the characteristics of the testing item 650, the data acquisition unit 640 may provide the information of these characteristics to the control unit 630. The control unit 630 may forward the raw data of the characteristics to a computation unit (not shown). The computation unit may process the raw data of the measured characteristics to enhance the reliability of the measured characteristics. For example, the computation unit may lower the noise of the measured characteristics through, for example, pre-processing, smooth and denoise, interpolation and extrapolation, and post-processing, but the disclosure is not limited thereto. In other embodiments, the computation unit may further feed the processed data of the measured characteristics back to the control unit 630, and the control unit 630 may provide the processed data of the measured characteristics to a user interface (not shown), such that the user may obtain reliable information of the characteristics of the testing item 650.

Figure 7:
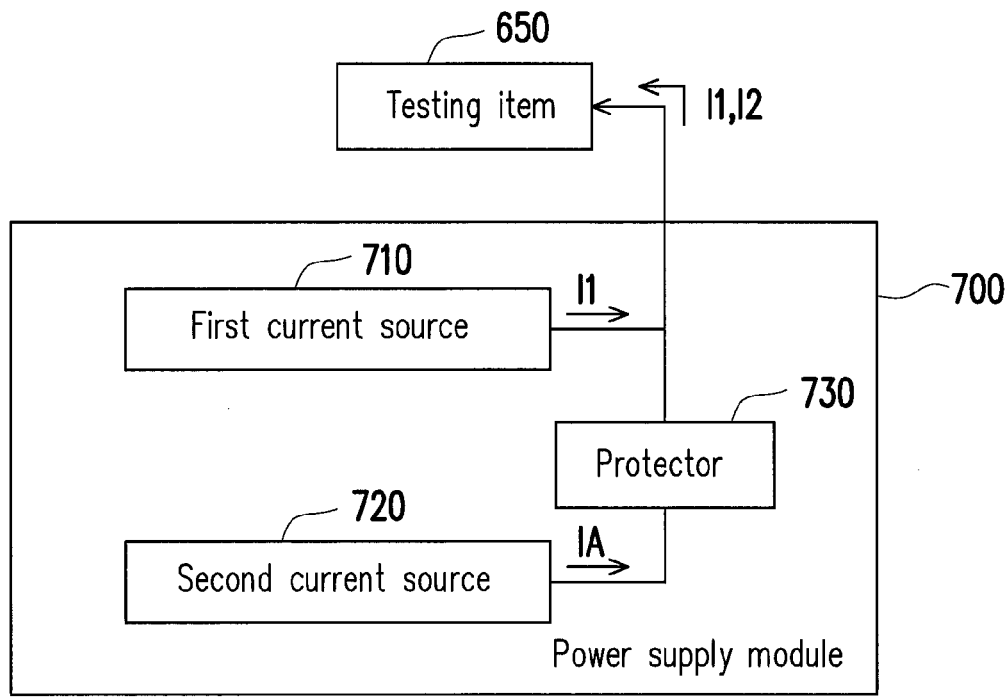
FIG. 7 is a schematic diagram illustrating the power supply module according to an exemplary embodiment of the disclosure.

FIG. 7 is a schematic diagram illustrating the power supply module according to an exemplary embodiment of the disclosure. In this embodiment, the power supply module 700 includes a first current source 710, a second current source 720 and a protector 730. The first current source 710 may be coupled to the testing item 650 and provide the first current I1 to the testing item 650. The second current source 720 may be coupled to the testing item 650 and the first current source 710 through the protector 730. The first current source 710 and the second current source 720 are independent current sources. The second current source 720 may provide an additional current IA. The protector 730 could be configured to prevent the first current I1 from feeding back to the second current source 720.

In this embodiment, the second current I2 could be a combination of the first current I1 and the additional current IA, and hence the control unit 630 may control the power supply module 700 to provide the first current I1 or the second current I2 by deactivating or activating the second current source 720. In detail, when the control unit 630 would need the power supply module 700 to provide the second current I2, the control unit 630 may activate the second current source 720, such that the second current source 720 would output the additional current IA. Therefore, the current that the power supply module 700 output to the testing item 650 would be a combination of the first current I1 and the additional current IA, i.e., the second current I2.

On the other hand, when the control unit 630 needs the power supply module 700 to provide the first current I1, the control unit 630 may deactivate the second current source 720, such that the second current source 720 would not output the additional current IA. Therefore, the current that the power supply module 700 output to the testing item 650 would be the first current I1. Meanwhile, the protector 730 may prevent the first current I1 from floating to the second current source 720, and hence the second current source 720 would not be affected by the first current I1.

In some embodiments, when the control unit 630 controls the power supply module 700 to switch from providing the second current I2 (e.g., the heating current $I_H$) to provide the first current I1 (e.g., the testing current $I_T$), there may occurs some current fluctuation during the current switching operation. As a result, the protector 730 may protect the second current source 720 from being negatively affected by the current switching operation.

Figure 8A:
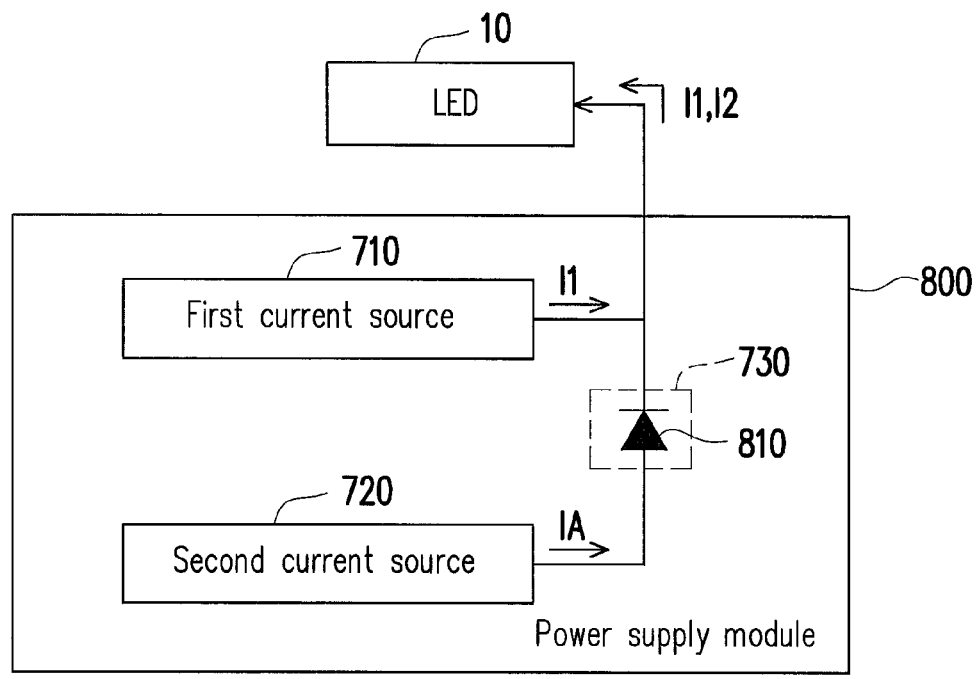
FIG. 8A is a schematic diagram illustrating the power supply module according to the embodiment of FIG. 7.

FIG. 8A is a schematic diagram illustrating the power supply module according to the embodiment of FIG. 7. In this embodiment, the protector 730 of the power supply module 800 may be a diode 810 and the testing item 650 may be the LED 10. The anode of the diode 810 may be coupled to the second current source 720, and the cathode of the diode 810 may be coupled to the first current source 710 and the LED 10. With the diode 810, the first current I1 would not feed to the second current source 720 while the power supply module 800 is providing the first current I1 to the LED 10.

Figure 8B:
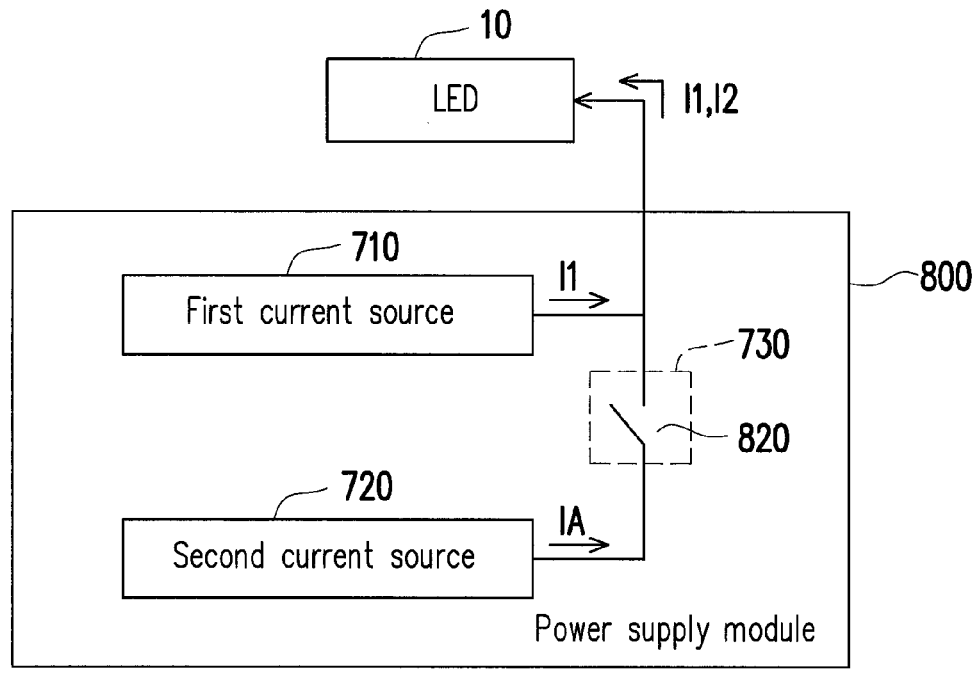
FIG. 8B is a schematic diagram illustrating the power supply module according to the embodiment of FIG. 7.

FIG. 8B is a schematic diagram illustrating the power supply module according to the embodiment of FIG. 7. In this embodiment, the protector 730 of the power supply module 800 may be a switch 820 and the testing item 650 may be the LED 10. A first terminal of the switch 820 may be coupled to the second current source 720, and a second terminal of the switch 820 could be coupled to the first current source 710 and the LED 10. The switch 820 may be implemented in various ways. For example, the switch 820 could be a mechanical switch, which may be manually switched by the user.

Alternatively, the switch 820 could be a transistor (such as a metal oxide semiconductor (MOS) transistor). The source (i.e., the first terminal of the switch 730) of the transistor may be coupled to the second current source 720, and the drain (i.e., the second terminal of the switch 730) of the transistor may be coupled to the first current source 710 and the testing item 650. The gate (not shown) of the transistor could be coupled to the control unit 630 and configured to receive a control signal from the control unit 630. The control signal could be configured for the control unit 630 to turn on or turn off the transistor (i.e., the switch 820). When the control unit 630 needs the power supply module 800 to output the first current I1, the control unit 630 may further send the control signal to the switch 820 for turning off the switch 820. Therefore, with the switch 820, the first current I1 would not feed to the second current source 720 while the power supply module 800 is providing the first current I1 to the LED 10.

Figure 9A:
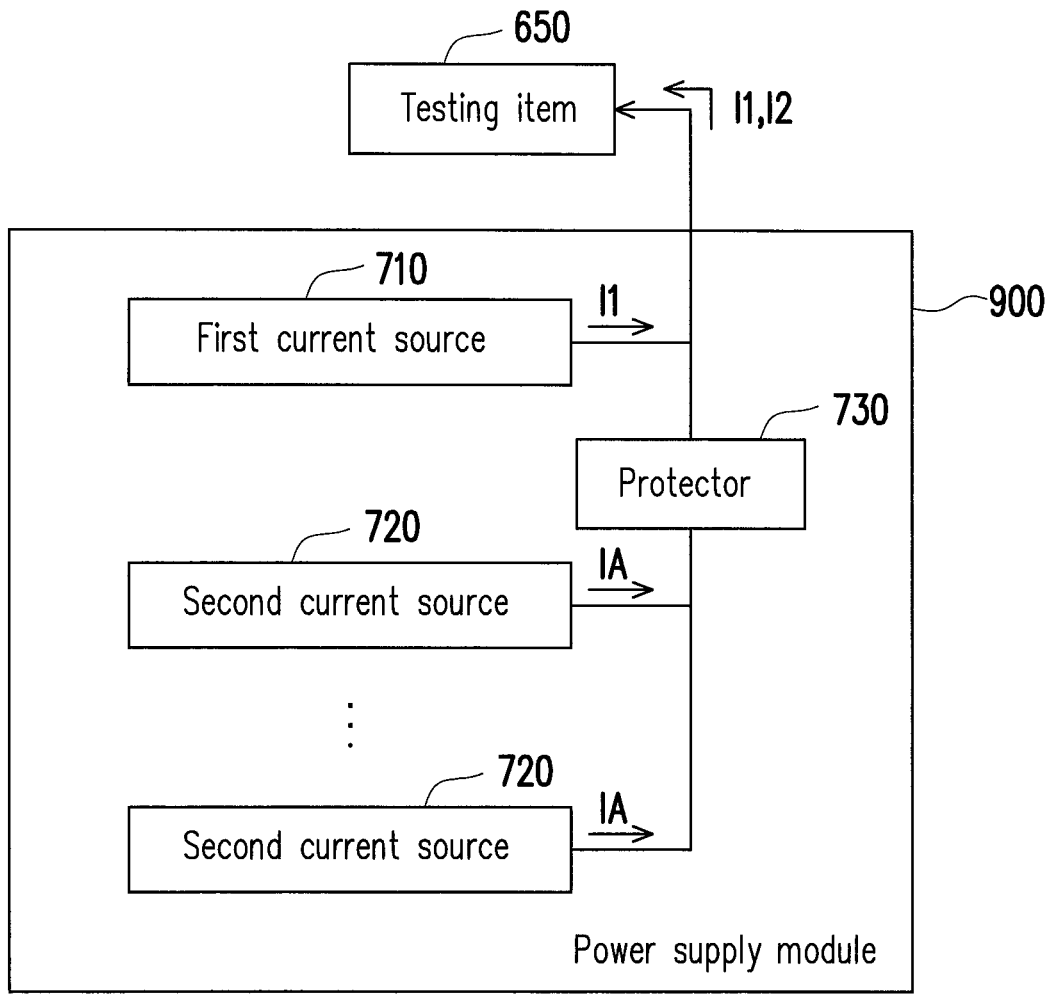
FIG. 9A is a schematic diagram illustrating the power supply module according to FIG. 7.

FIG. 9A is a schematic diagram illustrating the power supply module according to FIG. 7. In this embodiment, the power supply module 900 would include the first current source 710, a plurality of the second current sources and the protector 730. The second current sources would be connected in parallel, and all of the second current sources 730 would be coupled to the first current source and the testing item 650 through the protector 730. Each of the second current sources 720 may provide the corresponding additional current IA. With the configuration of FIG. 9A, the second current I2 could be a combination of the first current I1 and the additional currents IA. Similar to the aforementioned embodiments, the protector 730 may prevent the first current I1 from feeding back to the second current sources 720 while the power supply module 900 is providing the first current I1 to the testing item 650.

According to the aforementioned embodiments, the testing item 650 could be the LED 10, and the protector 730 may be a diode or a switch. Details of operating mechanisms of the testing item 650 and the protector 730 could be referred to the aforementioned embodiments, which would not be repeated herein.

Figure 9B:
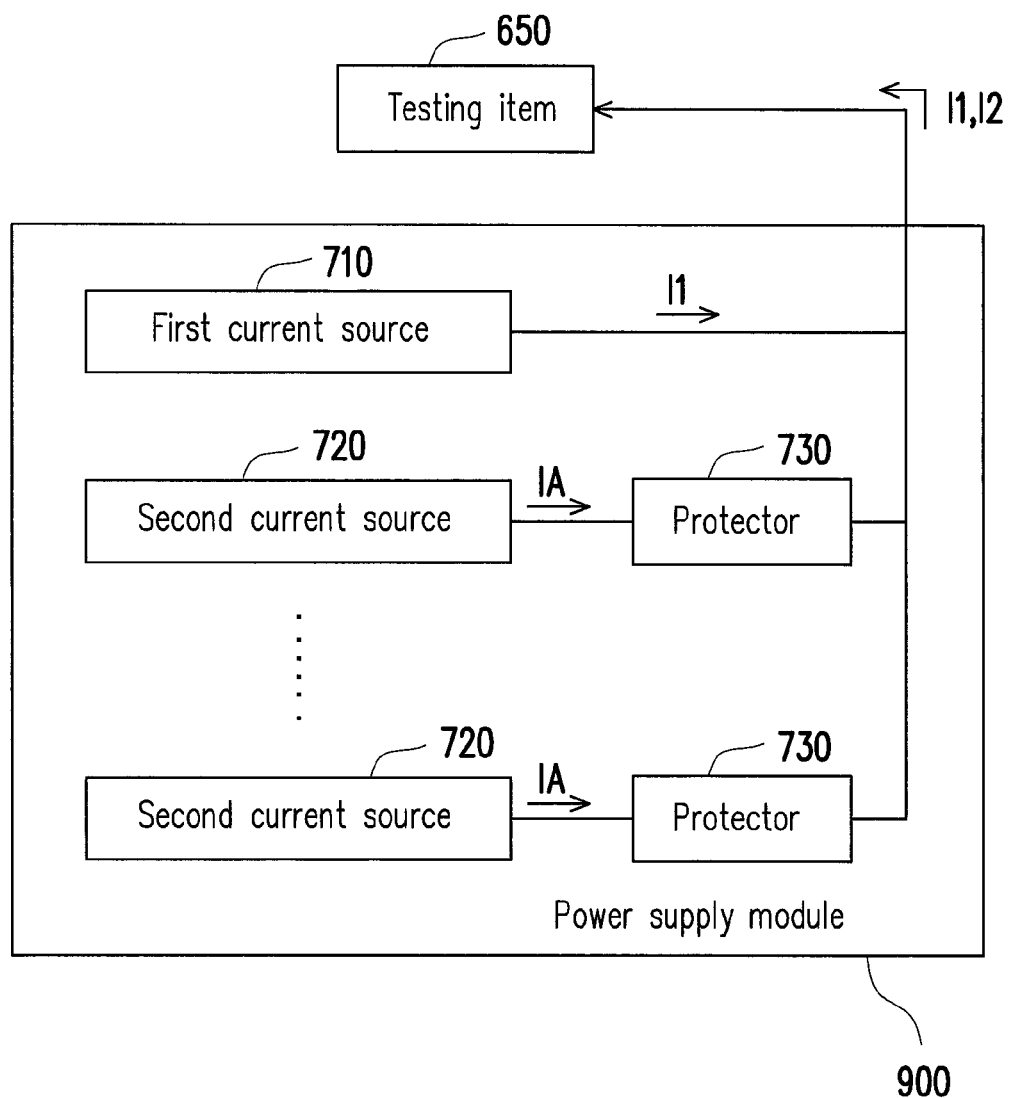
FIG. 9B is a schematic diagram illustrating the power supply module according to FIG. 7.

FIG. 9B is a schematic diagram illustrating the power supply module according to FIG. 7. In this embodiment, the power supply module 900 would include the first current source 710, a plurality of the second current sources and a plurality of the protector 730. The second current sources are connected in parallel, and each of the second current sources 730 is coupled to the first current source and the testing item 650 through one of the protectors 730. Each of the second current sources 720 may provide the corresponding additional current IA. With the configuration of FIG. 9A, the second current I2 may be a combination of the first current I1 and the additional currents IA. Similar to the aforementioned embodiments, the protector 730 may prevent the first current I1 from feeding back to the second current sources 720 while the power supply module 900 is providing the first current I1 to the testing item 650.

According to the aforementioned embodiments, the testing item 650 could be the LED 10, and each of the protectors 730 may be a diode or a switch. Details of the testing item 650 and the protectors 730 could be referred to the aforementioned embodiments, which would not be repeated herein.

Figure 10:
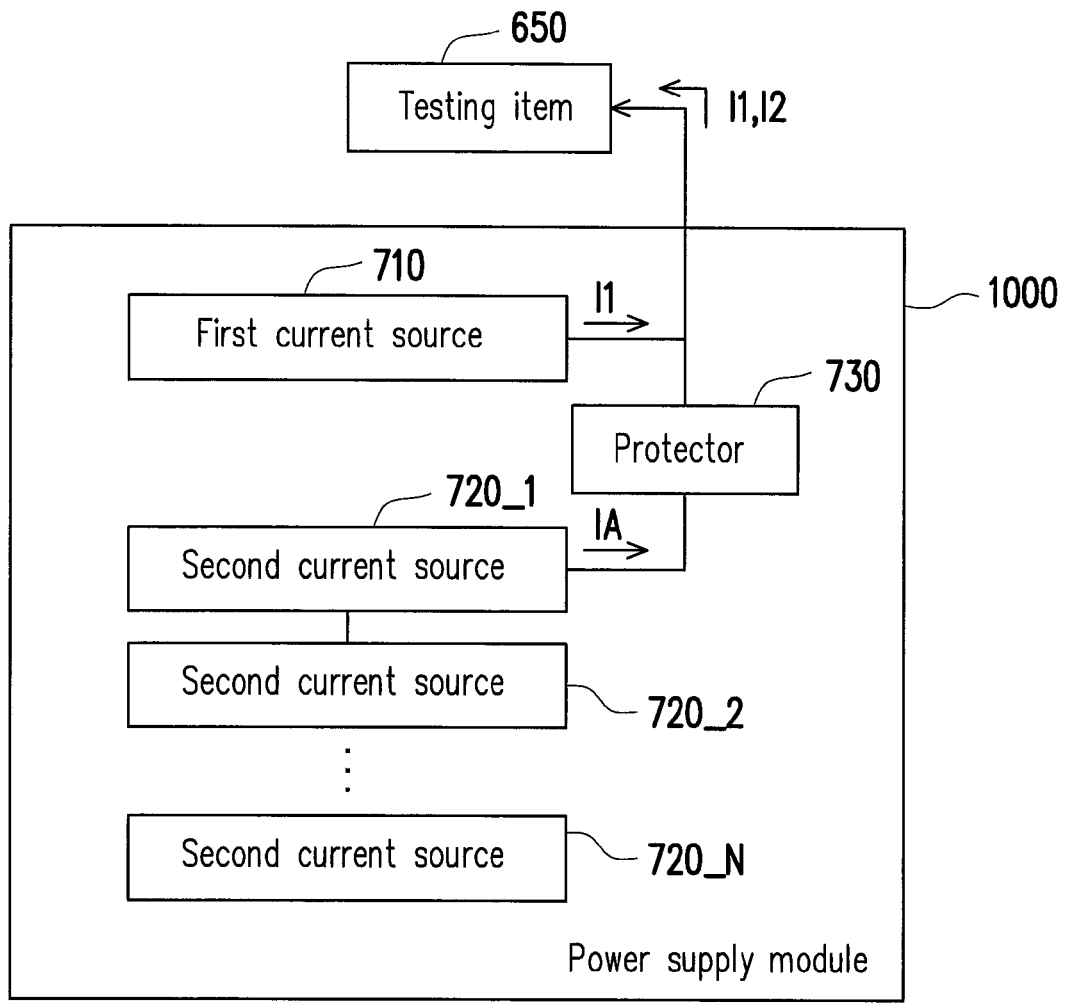
FIG. 10 is a schematic diagram illustrating the power supply module according to FIG. 7.

FIG. 10 is a schematic diagram illustrating the power supply module according to FIG. 7. The power supply module 1000 may include the first current source 710, the second current sources 720_1-720_N (N is a positive integer) and the protector 730. The second current sources 720_1-720_N would be connected in series, and the second current source 720_1 would be coupled to the first current source and the testing item 650 through the protector 730. The second current sources 720_1-720_N may provide the additional current IA. With the configuration of FIG. 10, the second current I2 could be a combination of the first current I1 and the additional current IA. Similar to the aforementioned embodiments, the protector 730 may prevent the first current I1 from feeding back to the second current sources 720 while the power supply module 900 is providing the first current I1 to the testing item 650.

Figure 11A:
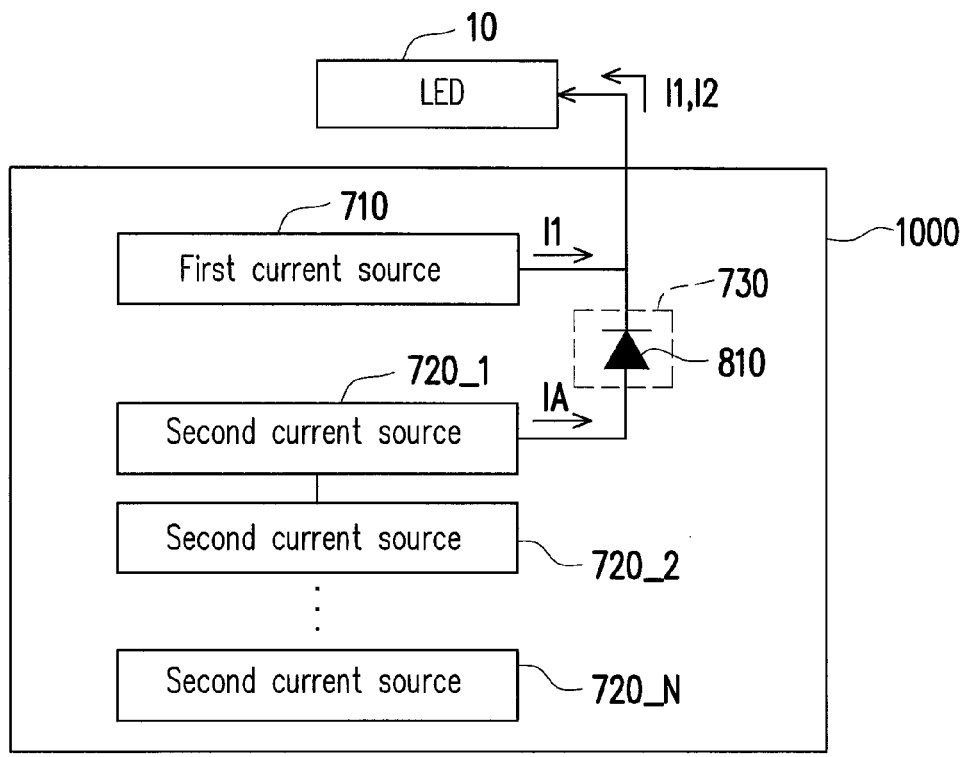
FIG. 11A is a schematic diagram illustrating the power supply module according to the embodiment of FIG. 10.

FIG. 11A is a schematic diagram illustrating the power supply module according to the embodiment of FIG. 10. In this embodiment, the protector 730 of the power supply module 1000 could be the diode 810 and the testing item 650 could be the LED 10. The anode of the diode 810 could be coupled to the second current source 720_1, and the cathode of the diode 810 could be coupled to the first current source 710 and the LED 10. With the diode 810, the first current I1 would not feed to the second current source 720 while the power supply module 800 is providing the first current I1 to the LED 10.

Figure 11B:
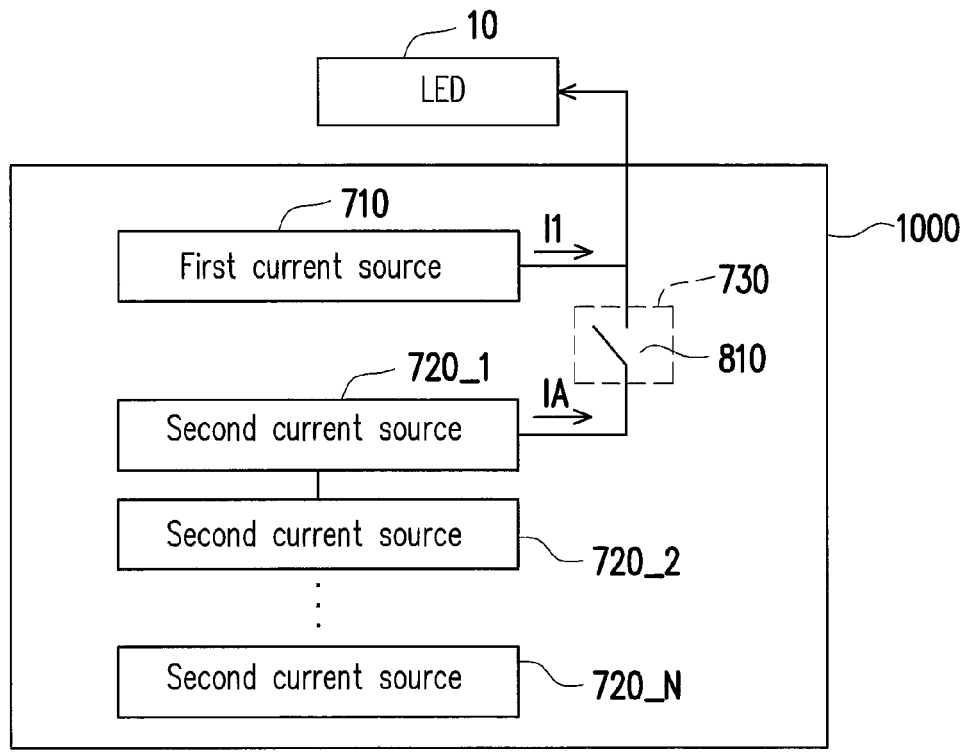
FIG. 11B is a schematic diagram illustrating the power supply module according to the embodiment of FIG. 10.

FIG. 11B is a schematic diagram illustrating the power supply module according to the embodiment of FIG. 10. In this embodiment, the protector 730 of the power supply module 1000 could be the switch 820 and the testing item 650 could be the LED 10. A first terminal of the switch 820 could be coupled to the second current source 720_1, and a second terminal of the switch 820 may be coupled to the first current source 710 and the LED 10. Details of the switch 820 could be referred to the aforementioned embodiments, which would not be repeated herein.

Figure 12:
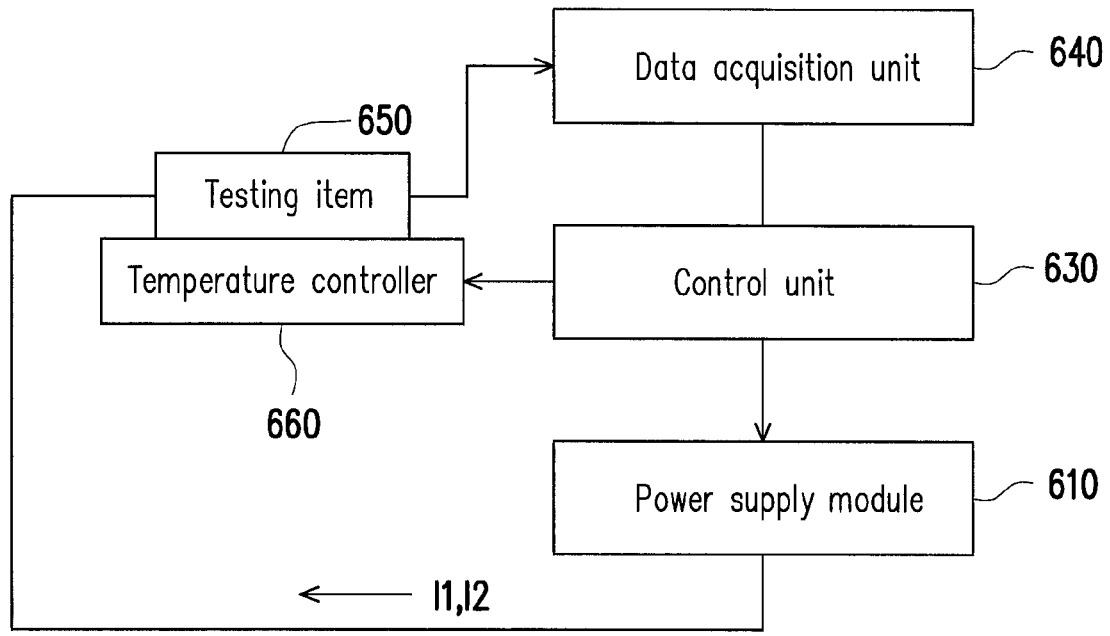
FIG. 12 is a schematic diagram illustrating a light emitting diode testing apparatus according to an exemplary embodiment of the disclosure.

FIG. 12 is a schematic diagram illustrating a light emitting diode testing apparatus according to an exemplary embodiment of the disclosure. In this embodiment, the testing apparatus 1200 includes the power supply unit 610, the control unit 630, the data acquisition unit 640 and a temperature controller 660. The temperature controller 660 could be configured to control the temperature of the testing item 650. For example, the control unit 630 may control the temperature controller 660 to adjust the temperature of the testing item 650 to an appropriate testing temperature. The details and variations of the power supply module 610 could be referred to the descriptions related to the FIG. 7-FIG. 11B, which would not be repeated herein.

Figure 13:
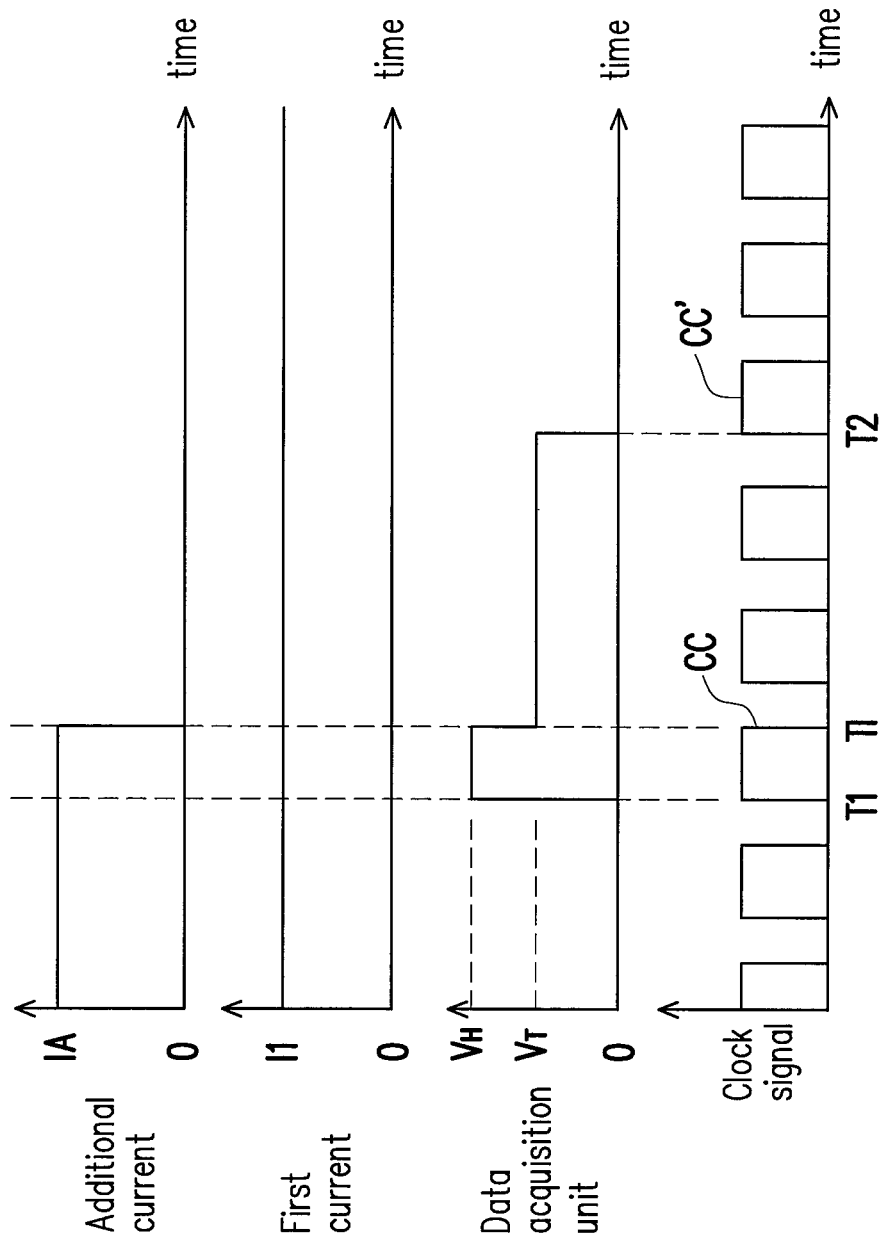
FIG. 13 is a schematic diagram illustrating the corresponding relationship between the first current, the additional current, the forward heating voltage, the forward testing voltage and a clock signal according to an exemplary embodiment of the present disclosure.

FIG. 13 is a schematic diagram illustrating the corresponding relationship between the first current, the additional current, the forward heating voltage, the forward testing voltage and a clock signal according to an exemplary embodiment of the present disclosure. In the present embodiment, the control unit 630 could activate the data acquisition unit 640 before the second current source stops providing the additional current IA, and deactivate the data acquisition unit 640 after measuring the characteristics of the testing item 650. To be specific, the control unit 630 may activate or deactivate the data acquisition unit 640 according to a clock signal. For example, if the additional current IA would be turned off (i.e., the second current source stops providing the additional current IA) at a timing point TI, which is between timing points T1 and T2, the data acquisition unit 640 could be activated at the timing point T1 (i.e., the rising or falling edge of a clock cycle CC) and deactivated at the timing point T2 (i.e., the rising or falling edge of a clock cycle CC'). Under this situation, the data acquisition unit 640 could properly measure the voltage variation between the forward heating voltage $V_H$ and the forward testing voltage $V_T$. From another point of view, the control unit 630 could accurately control the timing of activating/deactivating the data acquisition unit 640.

As could be observed in the previous embodiments, while the proposed light emitting diode apparatus is testing the LED, there is no need to provide another reference LED (which belongs to the same family of the LED) for, for example, cancelling out most of the forward drop at ambient temperature. Besides, the second current (i.e., the heating current) is not necessary to be always on.

In summary, the embodiments of the disclosure provide a testing apparatus and various implementations of the power supply module. Generally speaking, through the protector of the power supply module, the first current would not feed back to the second current source while the power supply module is controlled to switch from providing the second current to provide the first current. From another point of view, the protector may protect the second current source from being negatively affected during the current switch operation.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode testing apparatus, comprising:
a power supply module, providing a first current or a second current to a testing item;
a probe, coupled to the power supply module, measuring characteristics of the testing item;
a control unit, coupled to the power supply module, controlling the power supply module to provide the first current or the second current; and
a data acquisition unit, coupled to the control unit and the probe, acquiring the characteristics of the testing item from the probe,
wherein the power supply module comprises:
a first current source, coupled to the testing item, providing the first current to the testing item;
at least one second current source, coupled to the first current source and the testing item through at least one protector, providing at least one additional current, wherein the second current is a combination of the first current and the at least one additional current; and
the at least one protector, preventing the first current from feeding back to the at least one second current source,
wherein the control unit activates the data acquisition unit before the at least one second current source stops providing the at least one additional current, and deactivates the data acquisition unit after measuring the characteristics of the testing item.

2. The light emitting diode testing apparatus of claim 1, wherein the first current is between 1 mA and 10 mA.

3. The light emitting diode testing apparatus of claim 1, wherein the first current source and the at least one second current source are independent current sources.

4. The light emitting diode testing apparatus of claim 1, wherein the at least one second current source is connected in parallel.

5. The light emitting diode testing apparatus of claim 4, wherein each of the at least one second current source is coupled to the first current source and the testing item through one of the at least one protector.

6. The light emitting diode testing apparatus of claim 1, wherein the at least one second current source is connected in series.

7. The light emitting diode testing apparatus of claim 1, wherein the protector comprises a diode or a switch.

8. The light emitting diode testing apparatus of claim 7, wherein the switch is a mechanical switch.

9. The light emitting diode testing apparatus of claim 7, wherein the switch is a transistor.

10. The light emitting diode testing apparatus of claim 1, wherein the control unit further activate or deactivate the data acquisition unit according to a clock signal.

11. The light emitting diode testing apparatus of claim 1, wherein the data acquisition unit is a voltage meter.

12. The light emitting diode testing apparatus of claim 1, wherein the control unit is a processor.

13. A light emitting diode testing apparatus, comprising:
a power supply module, providing a first current or a second current to a testing item;
a temperature controller, controlling a temperature of the testing item;
a control unit, coupled to the power supply module and the temperature controller, controlling the power supply module to provide the first current or the second current, and controlling the temperature controller to adjust the temperature of the testing item; and
a data acquisition unit, coupled to the control unit, acquiring characteristics of the testing item,
wherein the power supply module comprises:
a first current source, coupled to the testing item, providing the first current to the testing item;
at least one second current source, coupled to the first current source and the testing item through at least one protector, providing at least one additional current, wherein the second current is a combination of the first current and the at least one additional current; and
the at least one protector, preventing the first current from feeding back to the at least one second current source,
wherein the control unit activates the data acquisition unit before the at least one second current source stops providing the at least one additional current, and deactivates the data acquisition unit after measuring the characteristics of the testing item.

14. The light emitting diode testing apparatus of claim 13, wherein the first current is between 1 mA and 10 mA.

15. The light emitting diode testing apparatus of claim 13, wherein the first current source and the at least one second current source are independent current sources.

16. The light emitting diode testing apparatus of claim 13, wherein the at least one second current source is connected in parallel.

17. The light emitting diode testing apparatus of claim 16, wherein each of the at least one second current source is coupled to the first current source and the testing item through one of the at least one protector.

18. The light emitting diode testing apparatus of claim 13, wherein the at least one second current source is connected in series.

19. The light emitting diode testing apparatus of claim 13, wherein the protector comprises a diode or a switch.

20. The light emitting diode testing apparatus of claim 19, wherein the switch is a mechanical switch.

21. The light emitting diode testing apparatus of claim 19, wherein the switch is a transistor.

22. The light emitting diode testing apparatus of claim 13, wherein the control unit further activate or deactivate the data acquisition unit according to a clock signal.

23. The light emitting diode testing apparatus of claim 13, wherein the data acquisition unit is a voltage meter.

24. The light emitting diode testing apparatus of claim 13, wherein the control unit is a processor.

\* \* \* \* \*